United States Patent [19]
Monk

[11] Patent Number: 6,133,796
[45] Date of Patent: Oct. 17, 2000

[54] PROGRAMMABLE DIVIDER CIRCUIT WITH A TRI-STATE INVERTER

[75] Inventor: Trevor Monk, Gwent, United Kingdom

[73] Assignee: STMicroelectronics Limited, Bristol, United Kingdom

[21] Appl. No.: 09/221,296

[22] Filed: Dec. 23, 1998

[30] Foreign Application Priority Data

Dec. 23, 1997 [GB] United Kingdom ............... 9727245

[51] Int. Cl.[7] .............................. H03L 7/16; H03K 23/66
[52] U.S. Cl. ................................ 331/16; 331/1 A; 331/8; 331/18; 327/115; 327/117; 327/118; 377/52
[58] Field of Search .................................. 331/1 A, 8, 16, 331/18, 25, 57; 327/115, 117, 118; 377/46–48, 52

[56] References Cited

U.S. PATENT DOCUMENTS

| | | | |
|---|---|---|---|
| 3,749,937 | 7/1973 | Rogers | 307/225 C |
| 3,958,187 | 5/1976 | Suzuki et al. | 331/74 |
| 4,114,049 | 9/1978 | Suzuki | 307/225 C |
| 4,389,728 | 6/1983 | Tsuzuki | 377/114 |
| 4,953,187 | 8/1990 | Herold et al. | 377/48 |
| 5,425,074 | 6/1995 | Wong | 377/47 |

FOREIGN PATENT DOCUMENTS

| | | | |
|---|---|---|---|
| 0 746 109A1 | 4/1996 | European Pat. Off. | |
| 62-026920 | 4/1987 | Japan | H03K 5/156 |
| WO 90/05413 | 5/1990 | WIPO | H03K 23/54 |

OTHER PUBLICATIONS

Suzuki et al., "Clocked CMOS Calculator Circuitry," *IEEE Journal of Solid–State Circuits* Dec. 1973, pp. 462–469.

*Primary Examiner*—David Mis
*Attorney, Agent, or Firm*—Theodore E. Galanthay; Robert Ianucci; Seed IP Law Group PLLC

[57] ABSTRACT

A programmable dividing circuit comprises a first plurality N of similar transistor stages connected in a divide-by-N sequence, wherein N is an odd integer, the transistor stages being configured so that when an output of the last stage is supplied to a first stage in the sequence, the dividing circuit operates as a divide-by-N circuit in which an output signal is generated which has one cycle for every N cycles of a clock signal applied to the transistor stages. The circuit includes a tri-state inverter selectively connectable in a divide-by-M sequence with a second plurality M of transistor stages, wherein M is an even integer, and wherein the second plurality M of transistor stages includes at least some of said first plurality N of transistor stages, including said first stage, whereby when an output of a last stage in the divide-by-M sequence is supplied to the first stage, the circuit operates as a divide-by-M circuit in which an output signal is generated which has one cycle for every M cycles of a clock signal applied to the transistor stages. The circuit includes a switching circuit having at least two inputs and arranged to selectively connect to the first stage, the output of the last stage in either the divide-by-N sequence or the divide-by-M sequence, whereby the circuit can be programmed to operate as a divide-by-N or divide-by-M circuit.

20 Claims, 16 Drawing Sheets

| IN (I1) | CLK | OUT (O1) |
|---------|-----|----------|
| 0 | 0 | Vdd |
| 0 | 1 | FLOAT |
| 1 | 0 | FLOAT |
| 1 | 1 | GND |

| CLK | V1 | V2 | V3 | |
|-----|----|----|----|---|
| 1 | 0 | 1 | 0 | |
| 0 | 1 | 1 | 0 | |
| 1 | 1 | 0 | 0 | |
| 0 | 1 | 0 | 1 | R1 |
| 1 | 0 | 0 | 1 | |
| 0 | 0 | 1 | 1 | |
| 1 | 0 | 1 | 0 | |
FIG. 4
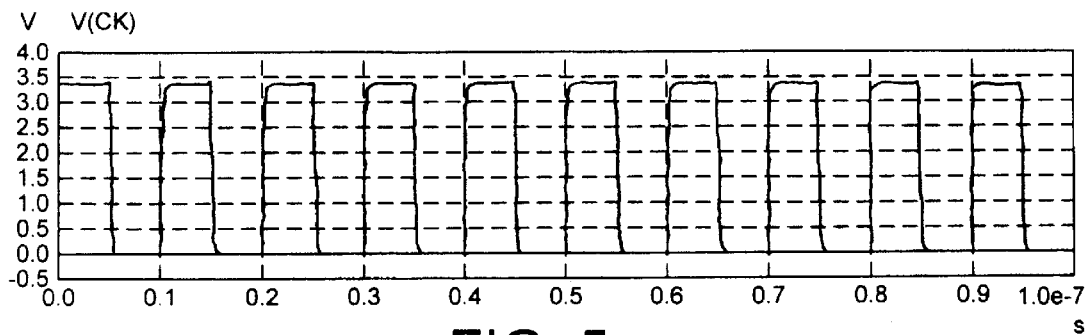
FIG. 5a
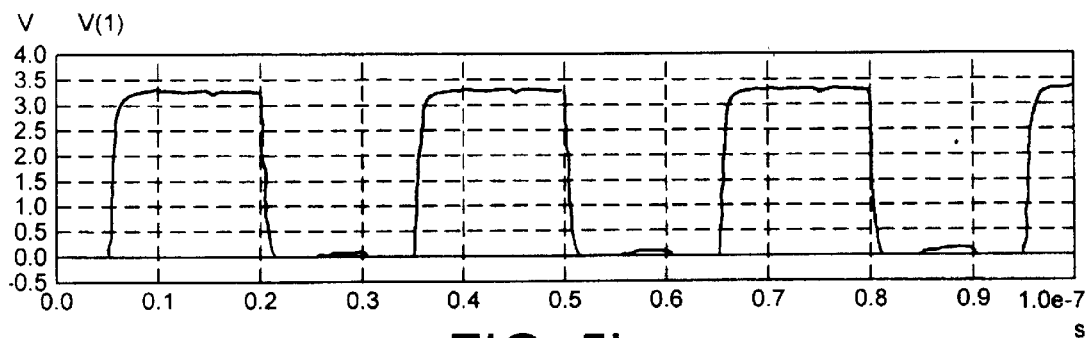
FIG. 5b
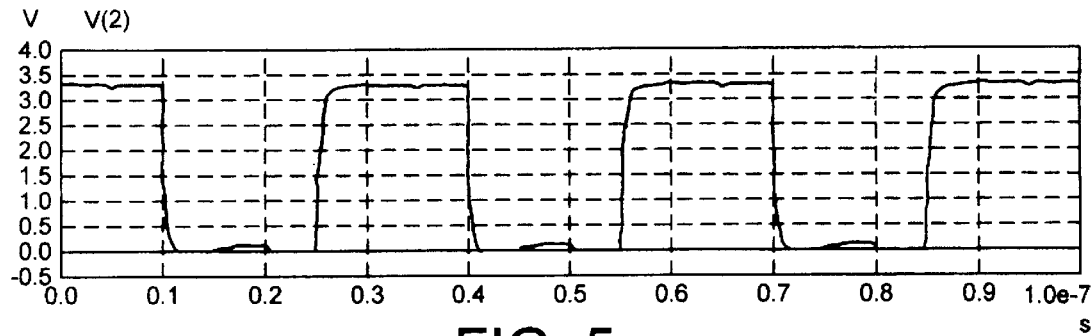
FIG. 5c

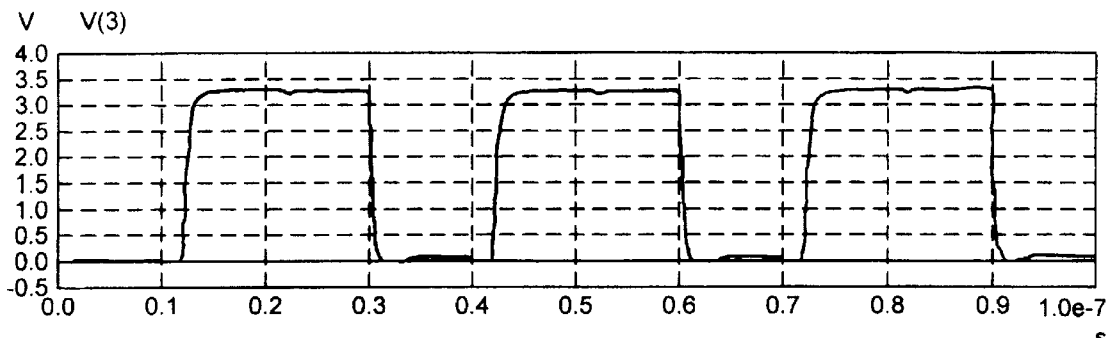
FIG. 6d
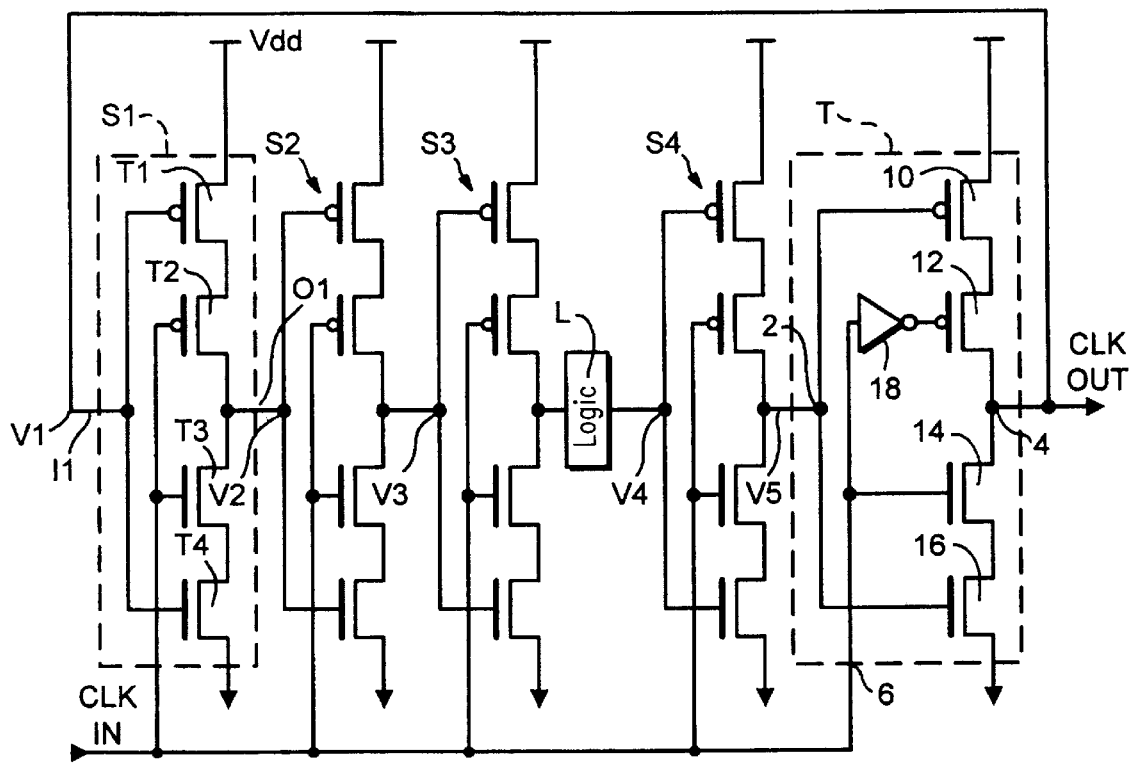
FIG. 7
| IN (2) | ENABLE (6) | OUT (4) |
|--------|------------|---------|
| 0 | 0 | FLOAT |
| 1 | 0 | FLOAT |
| 0 | 1 | 1 |
| 1 | 1 | 0 |
FIG. 8

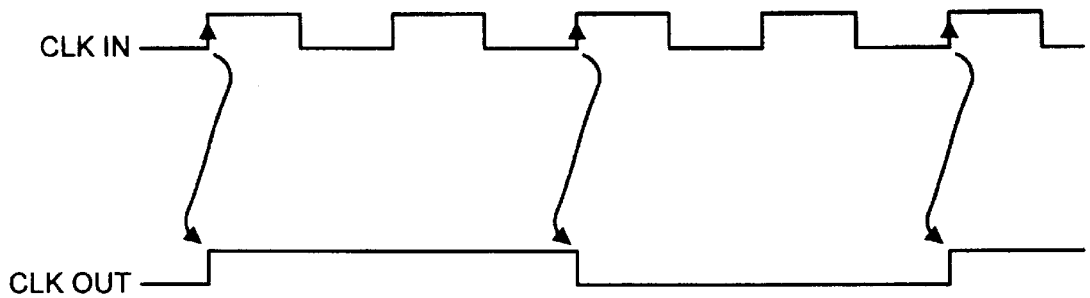
FIG. 9
| CLK IN | V1 | V2 | V3 | V4 | V5 | |
|---|---|---|---|---|---|---|
| 1 | 0 | 1 | 0 | 0 | 1 | INITIAL STATE |
| 0 | 0 | 1 | 0 | 1 | 1 | |
| 1 | 1 | 0 | 0 | 1 | 0 | |
| 0 | 1 | 0 | 1 | 1 | 0 | |
| 1 | 1 | 0 | 1 | 0 | 0 | |
| 0 | 1 | 0 | 1 | 0 | 1 | |
| 1 | 0 | 0 | 1 | 0 | 1 | |
| 0 | 0 | 1 | 1 | 0 | 1 | |
| 1 | 0 | 1 | 0 | 0 | 1 | |
| 0 | 0 | 1 | 0 | 1 | 1 | |
| 1 | 1 | 0 | 0 | 1 | 0 | |
V1 column braced as R2.
FIG. 10
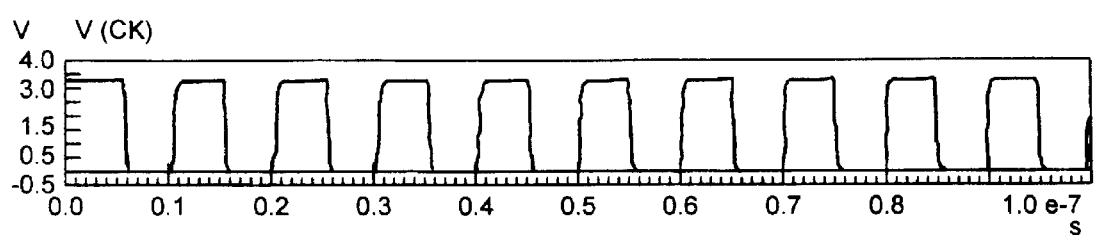
FIG. 11a

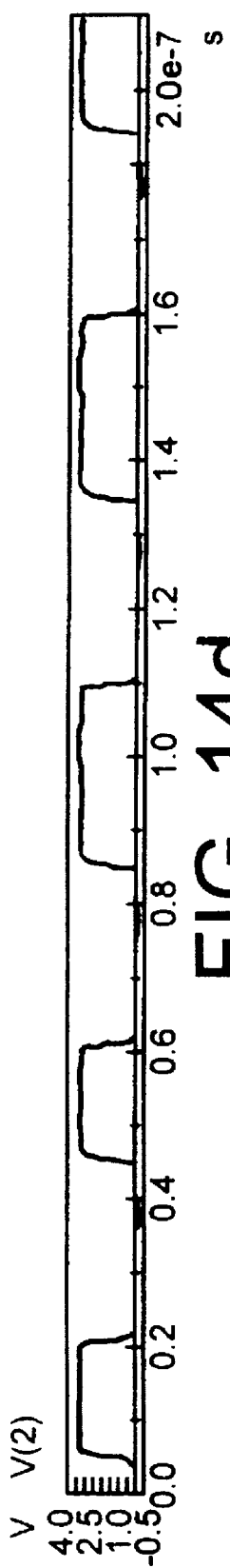
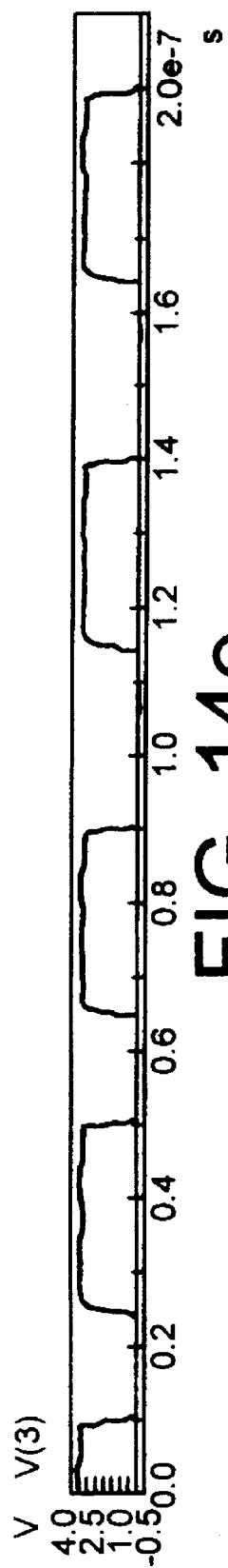
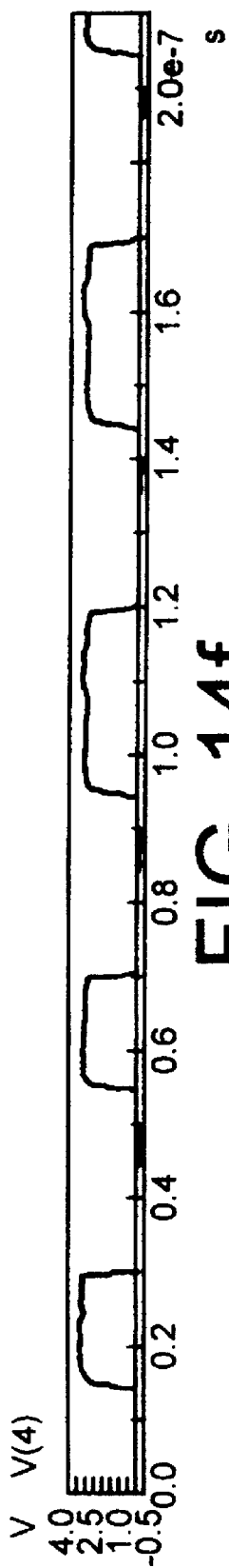
FIG. 14d
FIG. 14e
FIG. 14f

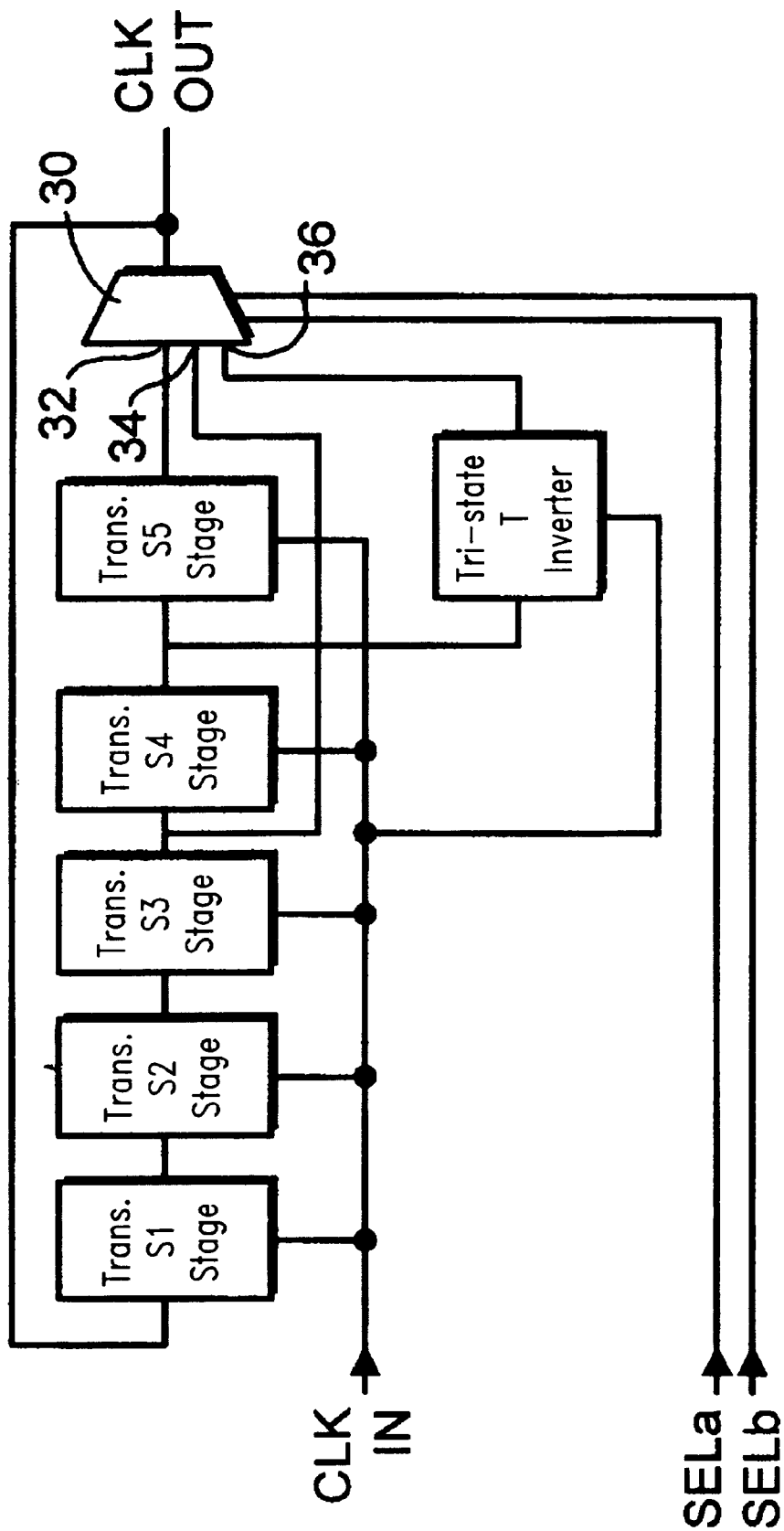

| SELa | SELb | RESULT |
|------|------|--------|
| 0 | 0 | DIV - 4 |
| 1 | 0 | DIV - 3 |
| 0 | 1 | DIV - 5 |

FIG. 16a

| SEL1 | SEL2 | RESULT |
|------|------|--------|
| 0 | 0 | DIV - 2 |
| 1 | 0 | DIV - 4 |
| 0 | 1 | DIV - 3 |
| 1 | 1 | DIV - 5 |

FIG. 17a

PROGRAMMABLE DIVIDER CIRCUIT WITH A TRI-STATE INVERTER

TECHNICAL FIELD

This invention relates to a programmable divider circuit which can selectively divide by predetermined odd or even integers.

BACKGROUND OF THE INVENTION

Clock divider circuits are useful in a number of applications, particularly in counters, where a complete cycle of an the output signal represents a predetermined number of incoming clock cycles. The cycles of the output signal can be used to "count" the incoming clock cycles.

It is desirable for such clock divider circuits to work at low power and at high frequencies. For example, desired operating parameters might be a current consumption of 10 μA at a supply voltage of 3.3 V, with an operating frequency of around 100 MHz. It is also desirable that such divider circuits consume a minimum amount of silicon when implemented on an integrated circuit.

Existing counters are generally based on binary counters. As the basic unit for a binary counter is a divide-by-two unit, extra logic is required to implement counts by odd numbers or even numbers which are not $2^n$, where n is an integer. This extra logic reduces the highest operating frequency obtainable by the counter and also consumes chip area. Moreover, existing binary counters rarely produce an output signal which has a 50% duty cycle when dividing by odd integers.

Signals having a 50% duty cycle are particularly desirable because in such signals, there is the maximum possible time for the rising and falling edges to complete. This avoids pulse shrinkage, both in terms of amplitude and timing of the signal, which can result in duty cycles which are significantly different from 50%, and which may affect the overall timing as a result. Moreover, many circuits use both the rising and falling edges of a clock signal, so that it can be advantageous to provide the falling edge midway through the cycle of rising edges.

An additional problem with existing binary counters is that those which operate with high speed, low power, and with short signal paths are generally not easily programmable to divide by different integers other than the one by which they are basically constructed to divide, particularly when these integers are odd integers.

SUMMARY OF THE INVENTION

An advantage of the present invention is to provide a programmable divider circuit which exhibits an improvement in operating frequency with reduced silicon consumption.

According to one aspect of the present invention there is provided a programmable dividing circuit comprising:

a first plurality N of similar transistor stages connected in a divide-by-N sequence, where N is an odd integer, the transistor stages being configured so that when the output of a last stage is supplied to a first stage in the sequence, the dividing circuit operates as a divide-by-N circuit in which an output signal is generated which has one cycle for every N cycles of a clock signal applied to the transistor stages;

a tri-state inverter selectively connectable in a divide-by-M sequence with a second plurality M of transistor stages, where M is an even integer, and wherein the second plurality includes at least some of said first plurality of transistor stages, including the first stage, whereby when an output of a last stage in the divide-by-M sequence is supplied to the first stage, the dividing circuit operates as a divide-by-M circuit in which an output signal is generated which has one cycle for every M cycles of a clock signal applied to the transistor stages; and a switching circuit having at least two inputs and arranged to selectively connect to the first stage the output of the last stage in either the divide-by-N sequence or the divide-by-M sequence, whereby the dividing circuit can be programmed to operate as a divide-by-N or divide-by-M circuit.

In one embodiment, there is a total of M stages connected in sequence with the tri-state inverter stage, an output of a last stage in the sequence being connected to one input of the switching circuit and the other input of the switching circuit being connected to an output of an (M−p)th stage in the sequence, where p is an odd integer and M−p=N. In the examples described herein, p=1, but the invention is not restricted to that.

In the embodiments described herein, the tri-state inverter stage is the last stage in the sequence and generates an output signal having a duty cycle of 50%. However, it is not necessary for the tri-state inverter stage to be the last stage in the sequence: it may be followed by a plurality of further stages.

In another embodiment, there is a common sequence of an even number x transistor stages which has an output node connected to first and second circuit branches. The first branch comprises q transistor stages where q is an odd integer greater than or equal to one, and the second branch comprises r transistor stages and said tri-state inverter, where r is an even integer greater than or equal to zero. Output of the first and second branches are connected to respective inputs of the switching circuit, wherein N=x+q and M=x+r.

In one embodiment described herein, q=1 and r=0, whereby N=M+1. However, the invention is not restricted to that.

Preferably the switching circuit is a multiplexer and can be provided with a select input for receiving a programming signal to effect the selective connection.

A single two-input multiplexer allows two different programmable options to be achieved. However, it is possible to provide a number of different dividing factors by providing one or more additional multiplexers and/or one or more additional inputs for each multiplexer. In this manner, a wide variety of different programming options for the dividing factor are available.

The invention further provides a phase-locked-loop circuit using a programmable dividing circuit as described herein.

The divider circuit described herein can operate at low powers, for example drawing a current of less than 10 μA at a supply voltage of 3.3 V, and can operate up to high frequencies. It is envisaged that operation up to a frequency of 1 GHz is possible, limited only by the characteristics of a single CMOS transistor.

BRIEF DESCRIPTION OF THE DRAWINGS

For a better understanding of the present invention and to show how the same may be carried into effect reference will now be made by way of example to the accompanying drawings.

FIG. 4 illustrates in tabular form a sequence of logic changes on nodes of the divide-by-three circuit of FIG. 1.

FIGS. 5a to 5d show representations of input and output waveforms in operation of the divide-by-three circuit of FIG. 1 where an input signal has a 50% duty cycle.

FIGS. 6a to 6d show representations of input and output waveforms for the divide-by-three circuit of FIG. 1 where an input signal has a 20% duty cycle.

FIG. 7 shows a circuit diagram of a divide-by-four circuit.

FIG. 8 is a truth table for a tri-state inverter stage of the circuit of FIG. 7.

FIG. 9 shows a representation of input and output signals for the circuit of FIG. 7.

FIG. 10 shows a sequence of logic states for the circuit of FIG. 7 in operation.

FIGS. 11a to 11f show representations of waveforms in operation of the divide-by-four circuit of FIG. 7.

FIGS. 14a to 14i show representations of waveforms in operation of the circuit of FIG. 13.

FIG. 16 shows a diagram of a programmable circuit which can divide by three, four, or five.

FIG. 16a shows a truth table for the circuit of FIG. 16.

FIG. 17a shows a truth table for the circuit of FIG. 17.

DETAILED DESCRIPTION OF THE INVENTION

Before describing the programmable divider circuit, a description of the operation of the basic divide-by-N and divide-by-M circuits is given. Firstly, a divide-by-three circuit is described as illustrated in FIG. 1.

The divide-by-three divider circuit comprises three stages S1, S2, S3 connected in a ring, with an input node of each stage connected to an output node of a preceding stage. Each stage comprises a first pair of p-channel MOS transistors T1, T2 and a second pair of n-channel MOS transistors T3, T4. Only the first stage S1 is described in detail herein, the remaining stages being the same. The transistors T1, T2 of the first pair are connected in series between a supply voltage Vdd and an output node 01. The transistors T3, T4 of the second pair are connected in series between the output node 01 and ground. The gate of the outermost transistor of each pair T1, T4 is connected to an input node I1 for the stage S1. The gates of the inner two transistors T2, T3 are connected to receive an input clock signal CLK IN and form a clock node for the stage.

S2 and S3 represent similar stages, each of which has an outer set of transistors connected to an input node for the stage and an inner set of transistors connected to the input clock signal CLK IN. An output signal may be taken from the divider circuit at the output node of any of the stages S1, S2, and S3, but in FIG. 1 a single output CLK OUT is shown for convenience at the output of the third stage S3.

Figures 1, 2, 3:
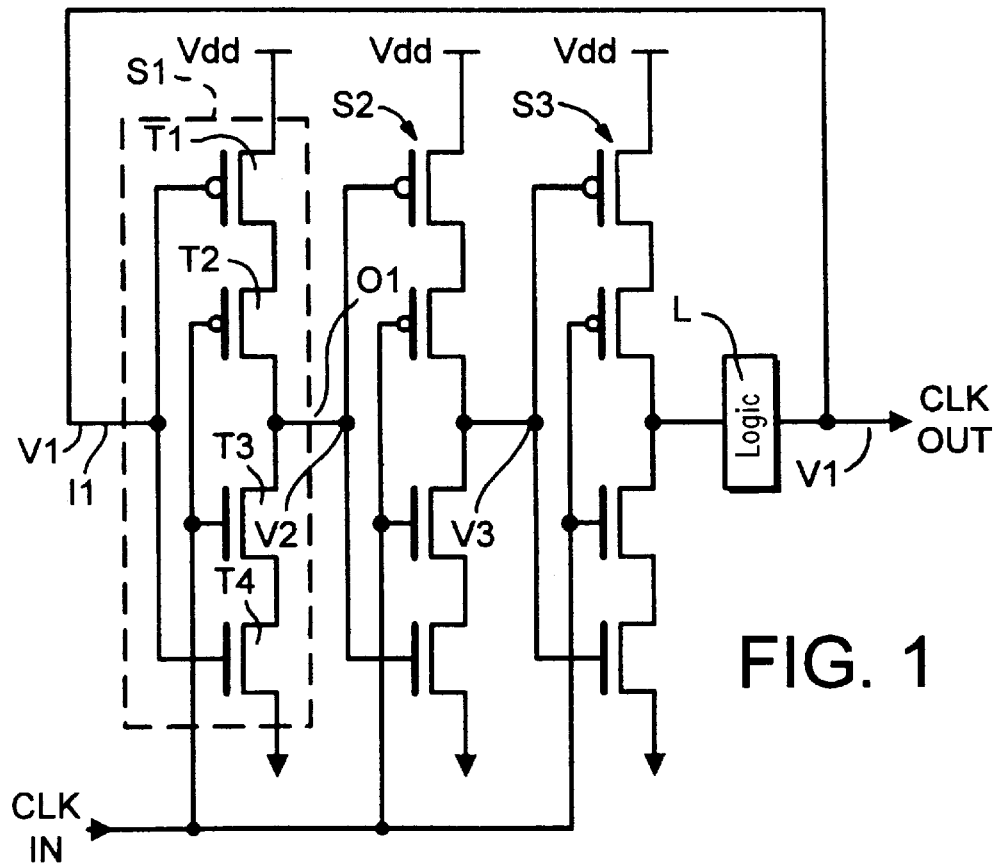
FIG. 1 shows a circuit diagram of a divide-by-three circuit.
FIG. 2 illustrates input and output signals for a divide-by-three circuit such as that shown in FIG. 1.
FIG. 3 shows a truth table of each stage of the divide-by-three circuit of FIG. 1.

As shown in FIG. 2, the divider circuit represents a divide-by-three counter. That is, one cycle of the output signal CLK OUT represents three cycles of the input clock signal CLK IN. To achieve this, the divider circuit causes a change in state in the output signal CLK OUT which is dependent not only on a clock edge but also on a logical state of data preceding the clock edge. In this context, the data is the signal applied to the input node of a stage from the preceding stage. There follows an explanation as to how the divider circuit of FIG. 1 achieves this.

FIG. 3 represents the truth table for each stage S1, S2, and S3 of the divider circuit of FIG. 1. Considering the stage S1, when a voltage at the input node I1 has logic stage zero, transistor T4 is off and transistor T1 is turned on. In this situation, when the input clock signal CLK IN has a logic state of zero, transistor T2 is likewise turned on, creating a current path which allows the output node 01 to be pulled up to Vdd, as shown in the first line of the truth table of FIG. 3. However, when the input clock signal CLK IN has a logic state of one, the transistor T2 is turned off with the consequence that the output node 01 "floats" at the logic state it held previously. That is, the output node 01 represents a high impedance state to the subsequent stage and is not driving any output current.

When the voltage at the input node I1 is in logic state one, the transistor T1 is turned off and the transistor T4 is turned on. Now, with the input clock signal CLK IN at logic state zero, the transistor T3 remains off and so the output node 01 floats. When the logic state of the input clock signal CLK IN changes to a one, the transistor T3 is turned on to create a current path allowing the transistors T3 and T4 to pull the output node 01 down to ground. The effect of this around the ring can be seen with reference to FIG. 4. Because there is an odd number of stages in the ring, it is inevitable that before each edge of the incoming input clock signal CLK IN, two consecutive stages will have the same logic level on their outputs. In the initial state discussed in FIG. 4, the nodes marked V1 and V3 both have a zero logic state. When the incoming input clock signal CLK IN changes state, the second of these logic states in the ring (at V1 in the example of FIG. 4), which was floating at a zero, is forced to change its state to a one. Thus, the outputs of stages S1 and S2 (marked as V1 and V2) now have the same logic level one. On the next change of state of the input clock signal CLK IN, the state of an input signal at the input node I1 is logic level one and the state of the input clock signal CLK IN is logic level one, which drives the state of the output node 01 (marked as V2 in FIG. 4) from its preceding floating state of a logic level one to a logic level zero. This sequence continues, resulting in the repeating cycle marked as R1 in FIG. 4, which is represented by the output waveform in FIG. 2.

Initialization is not required to start the divider circuit. It will self-start within a few cycles of the input signal as a result of small asymmetries in the layout. However, initialization circuitry may be added if desired to force a particular initial state. It will readily be appreciated that logic circuitry such as that marked as L in FIG. 1 may be inserted between any two sequential stages of the ring, provided that the logic circuitry L is not inverting.

Power consumption of the divider circuit is very low compared with existing divider circuits. One reason for this is that only one internal node changes state on each clock edge, so that the power consumption is dominated by the charge/discharge currents of the capacitance of a single node. Moreover, the maximum operating frequency of the divider circuit can be very high, because the delay introduced by each stage S1 to S3 is only that introduced by a single transistor. In other words, each stage S1 to S3 only comprises one "layer" of transistor logic requiring a change in state between input and output.

Figure 5D:
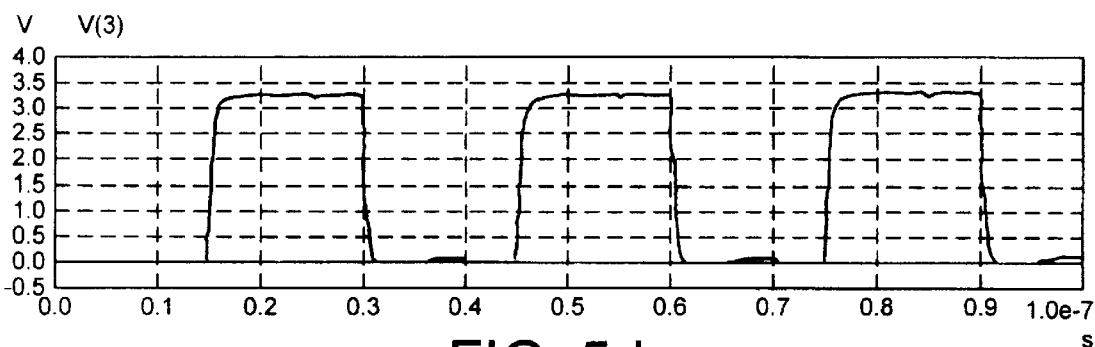

The circuit of FIG. 1 has the useful property of maintaining a duty cycle of 50% in the output signal if the input signal has a duty cycle of 50%. FIG. 5a represents the input clock signal CLK IN waveform at a duty cycle of 50%. FIGS. 5b to 5d represent the output waveforms at the nodes marked as V1, V2 and V3 in FIG. 1 respectively. As can be seen from FIGS. 5a to 5d, when the input clock signal CLK IN has a duty cycle of 50%, the output signal of each stage S1 to S3 also has a duty cycle of 50%. Furthermore, the output of each stage S1 to S3 has a specific and predictable phase relationship with the output of other stages, providing the designer with great flexibility concerning applications of the divider circuit.

The divider circuit also has the property of "improving" the duty cycle of the input clock signal CLK IN, where the duty cycle is not 50%. The manner of operation of the divider circuit ensures that an output signal always has a duty cycle closer to 50% than the input clock signal CLK IN. If the percentage difference from 50% of the duty cycle of the incoming input clock signal CLK IN is designated $\Delta_{IN}$, the difference $\Delta_{OUT}$ from 50% of the duty cycle in the output signal is $\Delta_{IN}$ divided by N, where N is the number of stages in the divider circuit. Thus, the "error" in the duty cycle is reduced by the number of stages in the divider circuit ring. An example of this is shown for the divide-by-three circuit in FIG. 1 in the waveforms of FIGS. 6a to 6d.

Figure 6A:
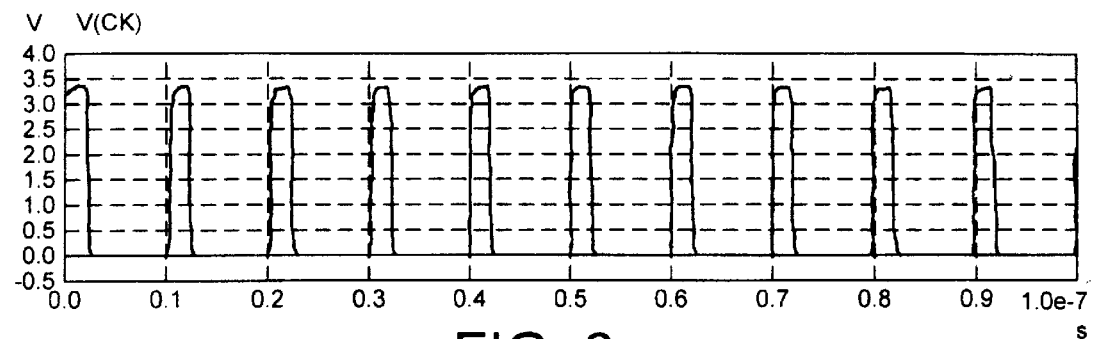
Figure 6B:
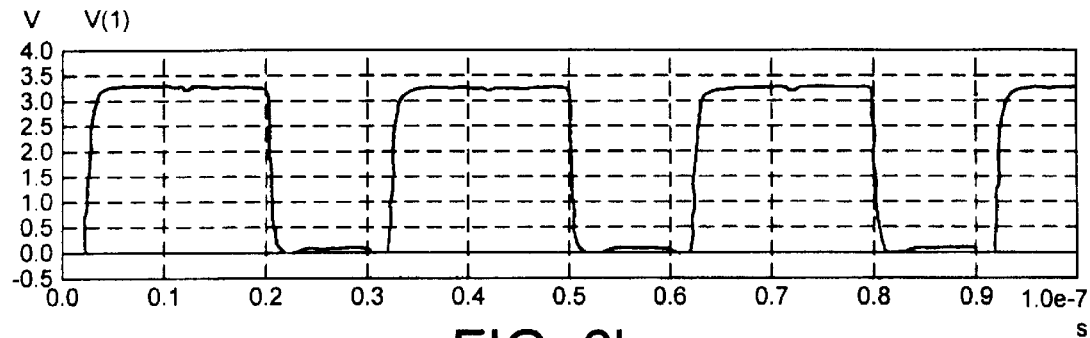
Figure 6C:
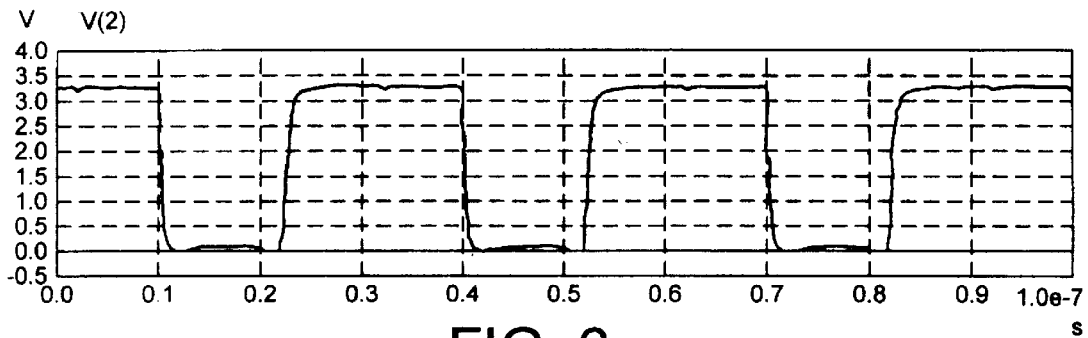

FIG. 6a represents the input clock signal CLK IN having a duty cycle of 20%. FIGS. 6b to 6d represent the output signals at each of the output nodes V1 to V3 from which it can readily be seen that the duty cycle of the output signal at any of the nodes is 60%. That is, according to the above calculation $$\Delta_{OUT} = \frac{[50-20]}{3} = 10\%.$$

The principle of the divide-by-three circuit illustrated in FIG. 1 and described above can readily be extended to other odd numbers (e.g., 5, 7, 9, etc.).

FIG. 8 illustrates a divide-by-four circuit. The divide-by-four circuit comprises four stages S1, S2, S3, and S4, and a tri-state inverter stage T connected in a ring with an input node of each stage connected to an output node of a preceding stage. Each of the four stages S1 to S4 has the transistor configuration described above with reference to FIG. 1 in the divide-by-three circuit.

The tri-state inverter stage T has an input node 2 connected to the output node of the preceding stage S4, an output node 4 which is connected to the input node of the transistor stage S1, and an enable input 6 which is connected to the clock nodes of the transistor stages S1 to S4. Tri-state inverters are known in the art and have the truth table shown in FIG. 8, where the state marked "float" has the same meaning as that applied to the transistor stages S1 to S4. One exemplary circuit configuration of a tri-state inverter is illustrated in stage T of FIG. 1, but it will be appreciated that other tri-state inverters can be used with the present invention. In the example of FIG. 7, the tri-state inverter T has a pair of p-channel transistors 10, 12 connected between the supply voltage Vdd and the output node 4, and a pair of n-channel transistors 14, 16 connected in series between the output node 4 and ground. The gates of the outermost transistors 10, 16 are connected together to provide the input node 2 for the tri-state inverter T. The gate of the innermost p-channel transistor 12 is connected to the enable input 6 via an inverter 18. The gate of the innermost n-channel transistor 14 is connected directly to the enable input 6. In the circuit of FIG. 7, the enable input 6 receives the input clock signal CLK IN supplied to the divide-by-four circuit, and thus acts as the clock node for the stage T.

As shown in FIG. 9, the circuit of FIG. 7 represents a divide-by-four counter. That is, one cycle of the output signal CLK OUT represents four cycles of the input clock signal CLK IN. To achieve this, the circuit causes a change in state in the output signal only on every other rising edge of the input clock signal CLK IN. That this is the case can be seen by following through the effect of the truth tables of FIGS. 3 and 8, as in the following description of FIG. 10. Consider the initial state of the circuit illustrated in FIG. 10, where the logic state of the input clock signal CLK IN is high or logic one. The output signal CLK OUT has the same logic state as the input stage I1 for the first stage S1, and is marked as V1 in FIG. 10. V2 to V5 represent the output signals of the stages S1 to S4 respectively. In the initial state of FIG. 10, V2 has logic value one, V3 and V4 have logic value zero and V5 has logic value one. When the incoming clock signal CLK IN changes state to logic level zero, the stage S1 has its clock node at zero and its input V1 at zero, so that its output V2 remains at logic level one. The stage S2 still has an input signal V2 at logic state one, but because the state of the incoming clock signal CLK IN is now zero, the output node V3 now floats at logic state zero. The stage S3 now has an input state of zero, where the input clock signal CLK IN is zero, thus the state of its output V4 changes to logic state one. The stage S4 now has a logic state of one at its input while the clock signal is low, so that its output V5 floats at the preceding logic state one. The tri-state inverter stage T has an input signal at 2 at logic state one, while the state of the input clock signal CLK IN is low, so that the output V1 floats at the preceding logic state, that is, at logic state zero. This analysis can be followed through for the subsequent changes in state of the incoming input clock signal CLK IN with reference to the truth tables of FIGS. 3 and 8. The result is the tabular data shown in FIG. 10, from which it can be seen that the sequence results in the repeating cycle marked as R2, which is represented by the output waveform in FIG. 9.

Figure 11B:
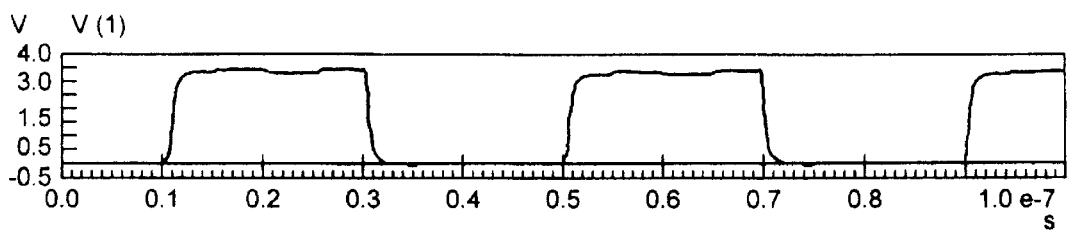
Figure 11C:
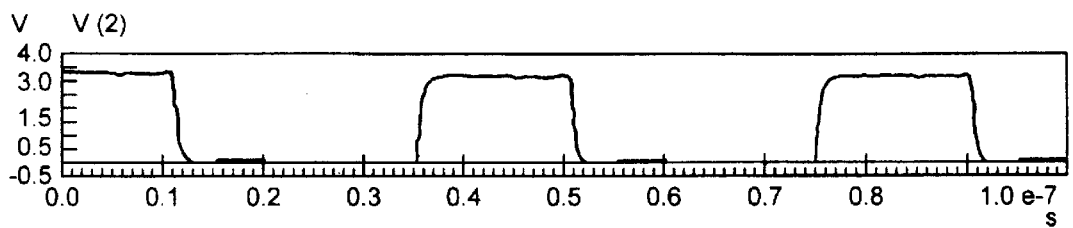
Figure 11D:
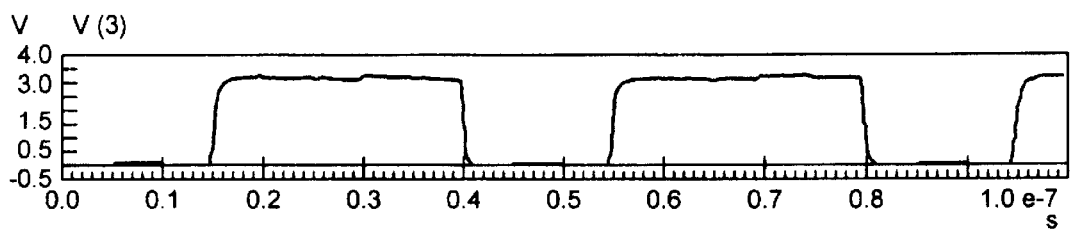
Figure 11E:
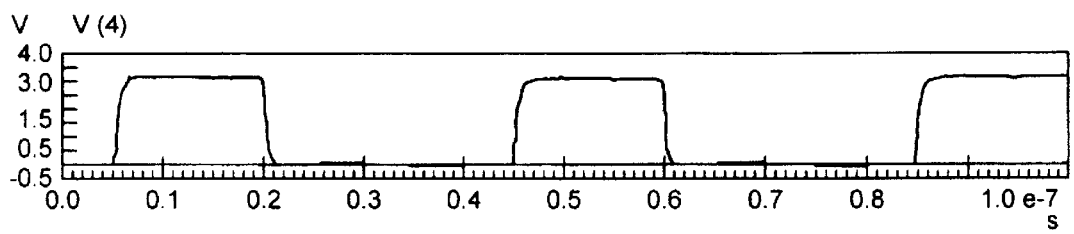
Figure 11F:
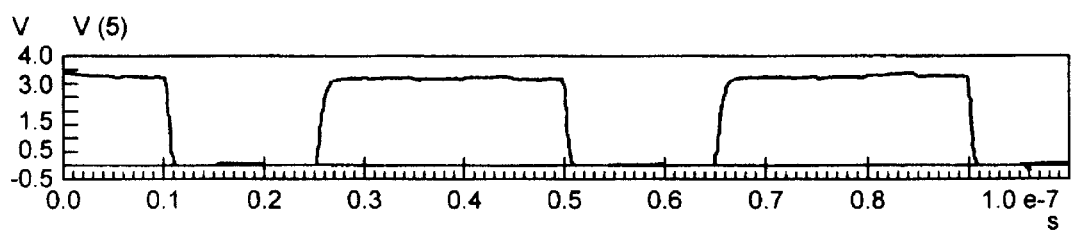

FIG. 11a represents an input waveform of the input clock signal CLK IN having a duty cycle of 50%. FIG. 11b shows the output signal (marked as V(1) in FIG. 11b) at the output node 4 of the tri-state inverter stage T.

The output signal is a divide-by-four version of the input clock signal CLK IN and has a duty cycle of 50%. The outputs of the other transistor stages S1 to S4 labeled V(2) to V(5) are shown in FIGS. 11c to 11f. These outputs still represent a divide-by-four version of the input signals, but do not have a 50% duty cycle.

The principle of operation of the divide-by-four circuit shown in FIG. 7 can readily be extended to other even numbers to provide a divide-by-M circuit, where M is an even integer.

Figure 12:
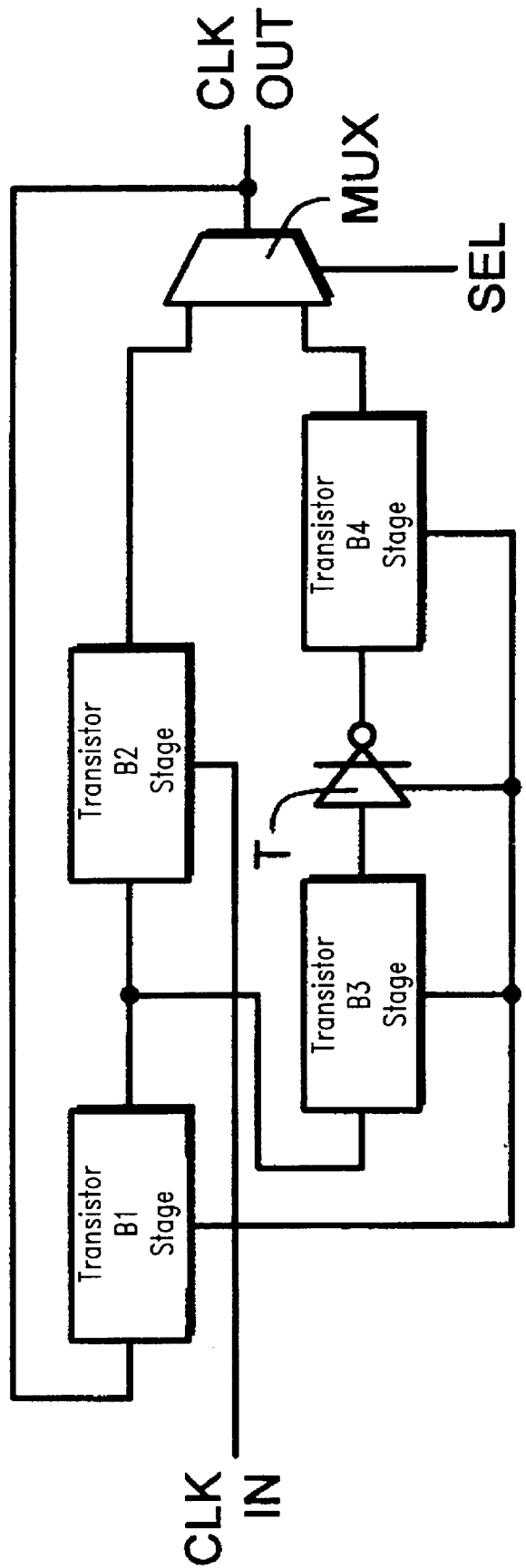
FIG. 12 shows a block diagram illustrating the concept of programmability.

The principle of operation of these circuits can be combined to provide a programmable divider circuit which can selectively divide by an odd and an even integer. FIG. 12 is a block diagram illustrating the concept underlying a programmable divider circuit. In FIG. 12, each block B1, B2, B3 and B4 represents a number of similar transistor stages of the type denoted S1 to S4 in the preceding description. Reference T denotes the tri-state inverter stage as described herein. The input clock signal CLK IN is supplied to the clock nodes of the transistor stages in each sequence B1 to B4 and to the tri-state inverter stage T. A first sequence of transistor stages represented by blocks B1 and B2 are supplied to a first input of a multiplexer MUX. A second sequence of transistor stages comprising blocks B1, B3, T, and B4 are supplied to a second input of the multiplexer MUX. The block B1 represents an input sequence of transistor stages, the first stage in the sequence of block B1 receiving an output signal from the multiplexer MUX. The output CLK OUT of the divider circuit is taken from the output of the multiplexer MUX. The multiplexer MUX has a select input which receives a select signal SEL, which selects whether the block sequence B1, B2 or the block sequence B1, B3, T, B4 is connected in a ring. The number of stages in the blocks B1 to B4 is selected so that the combination of blocks B1 and B2 provides an odd number N of transistor stages and the combination of blocks numbered B1, B3 and B4 provides an even number M of transistor stages. In these circumstances, it can now be seen that by appropriate use of the signal SEL, the divider ring can either contain N stages, or M stages and the tri-state inverter stage T. In the first case, the circuit acts as a divide-by-N counter, and in the second case, it acts as a divide-by-M counter. Where the number of transistor stages in a block B1 is odd, it is quite possible for block B2 to contain no transistor stages, so that the output of block B1 is connected directly to the first input of the multiplexer MUX. Likewise, the output of the tri-state inverter T can be connected directly to the second input of the multiplexer MUX, in which case the block B4 has no transistor stages in it. This is required where the divider circuit is to generate an output signal CLK OUT having a 50% duty cycle. Although a single two-input multiplexer is illustrated in FIG. 12, it will be appreciated from the following descriptions that a multiplexer having more than two inputs is possible, as is the provision of more than one multiplexer in the sequence of transistor stages. Thus, a variety of different possibilities are made available. A selection of particular examples is now described, but it will readily be appreciated that the principles underlying the present invention can be extended to provide a large number of different options for generating a programmable divider circuit.

Figure 13:
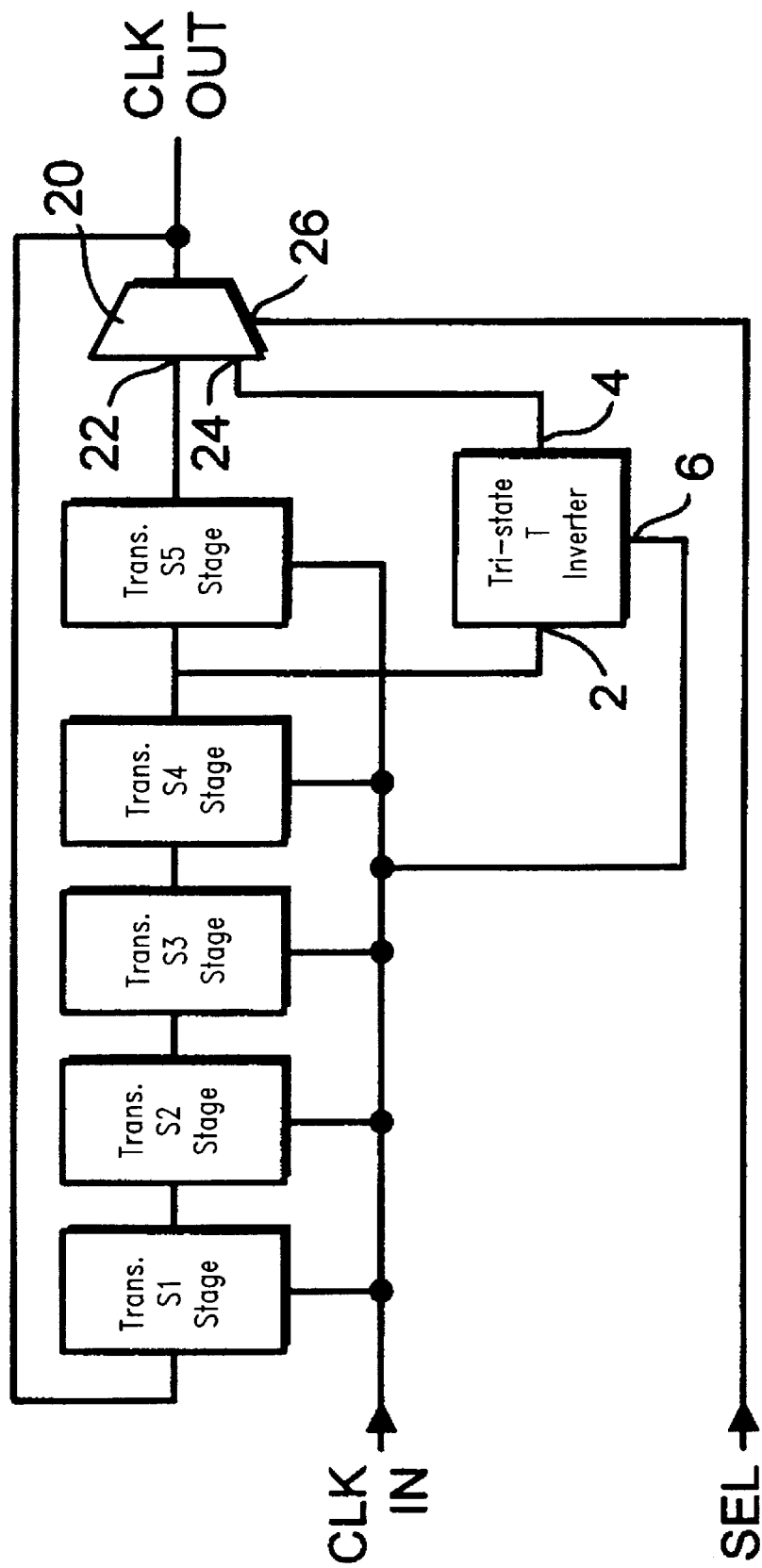
FIG. 13 shows a circuit diagram of a programmable circuit which can divide by four or five.

A first example is illustrated in FIG. 13, which is a programmable divide-by-four/divide-by-five counter. The circuit has five transistor stages S1 to S5 connected in sequence. When the output of the fifth transistor stage S5 is connected to the input of the first transistor stage S1 in the sequence, the circuit operates as a divide-by-five circuit using the same principles as described above with reference to the divide-by-three circuit of FIG. 1. However, the circuit of FIG. 13 also comprises a tri-state inverter stage T which has its input node 2 connected to the output of the fourth transistor stage S4. The enable node 6 of the tri-state inverter stage T receives the input clock signal CLK IN the same manner as described above with reference to the divide-by-four circuit of FIG. 7. A multiplexer 20 has a first input 22 connected to the output of the transistor stage S5 and a second input 24 connected to the output 4 of the tristate inverter stage T. The output of the multiplexer 20 is connected to the input of the first transistor stage S1 in the sequence. A select input 26 receives a select signal SEL which determines whether the first or second input of the multiplexer 20 is connected to the output of the multiplexer 20. When the output of the transistor stage S5 is connected to the first transistor stage S1, the circuit operates as a divide-by-five circuit. Alternatively, when the output of the tri-state inverter stage T is connected to the input of the transistor stage S1, then the circuit operates as a divide-by-four circuit based on the principles discussed above with reference to FIG. 7. Thus, by controlling the state of the select signal SEL, the circuit can selectively divide by four or five.

Figure 14A:
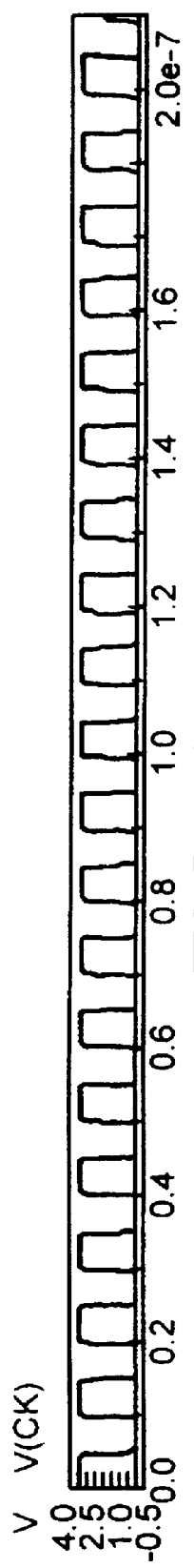
Figure 14B:
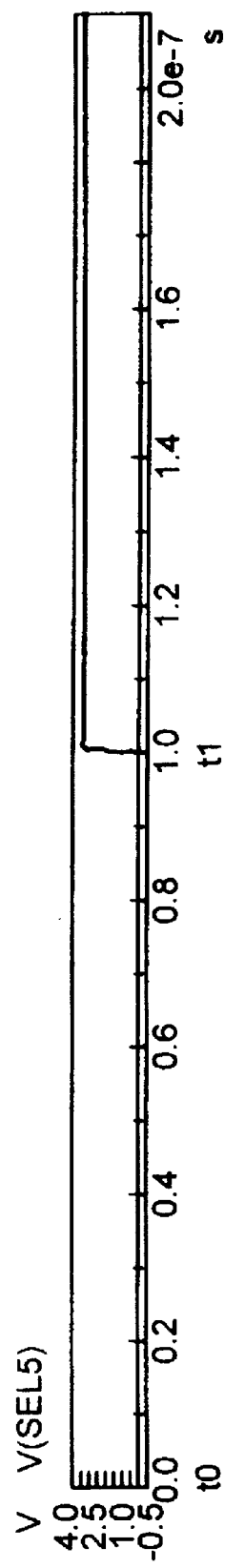
Figure 14C:
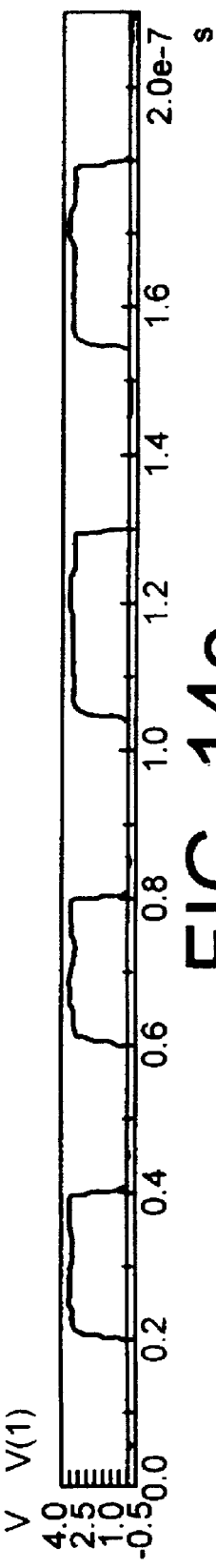
Figure 14G:
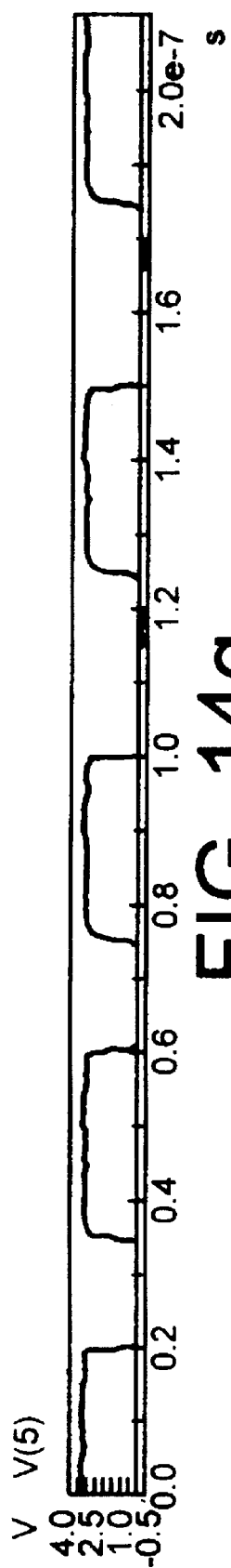
Figure 14H:
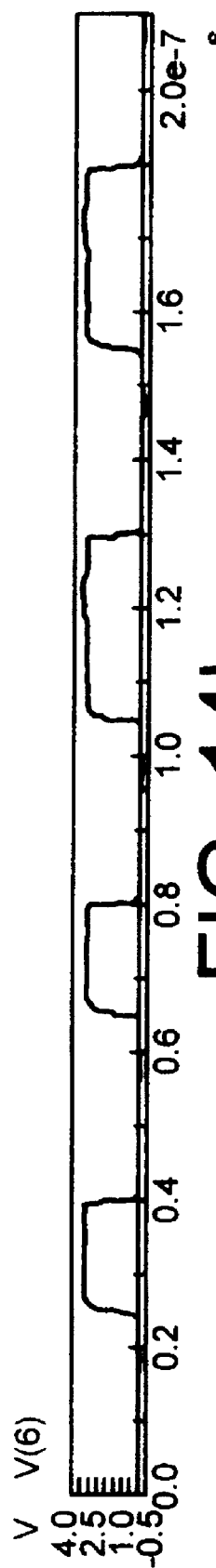
Figure 14I:
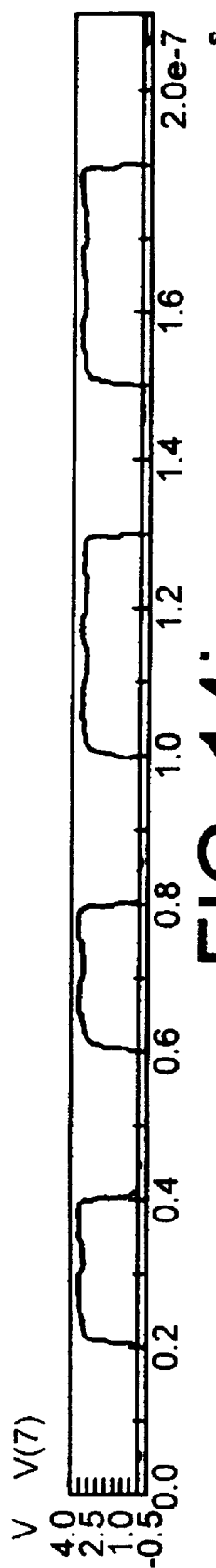

FIG. 14 illustrates operation of the circuit of FIG. 13 with an input clock signal CLK IN having a 50% duty cycle, as illustrated in FIG. 14a. FIG. 14b illustrates the state of the select signal SEL supplied to the select input of the multiplexer 20. At time t0, the select signal SEL is low, causing the second input of the multiplexer 20 to be supplied to its output, and thus connecting in a ring four of the transistor stages S1 to S4 and the tri-state inverter stage T. The circuit thus operates as a divide-by-four circuit, as can be seen from the output waveforms between time t0 and t1 in FIGS. 14c to 14i. At time t1, the select signal SEL goes high, thus causing the first input 22 of the multiplexer 20 to be connected to its output. In this case therefore the five transistor stages S1 to S5 are connected in a ring so that the circuit operates as a divide-by-five circuit, as can be seen from the waveforms in FIGS. 14c to 14i after time t1.

Figure 15:
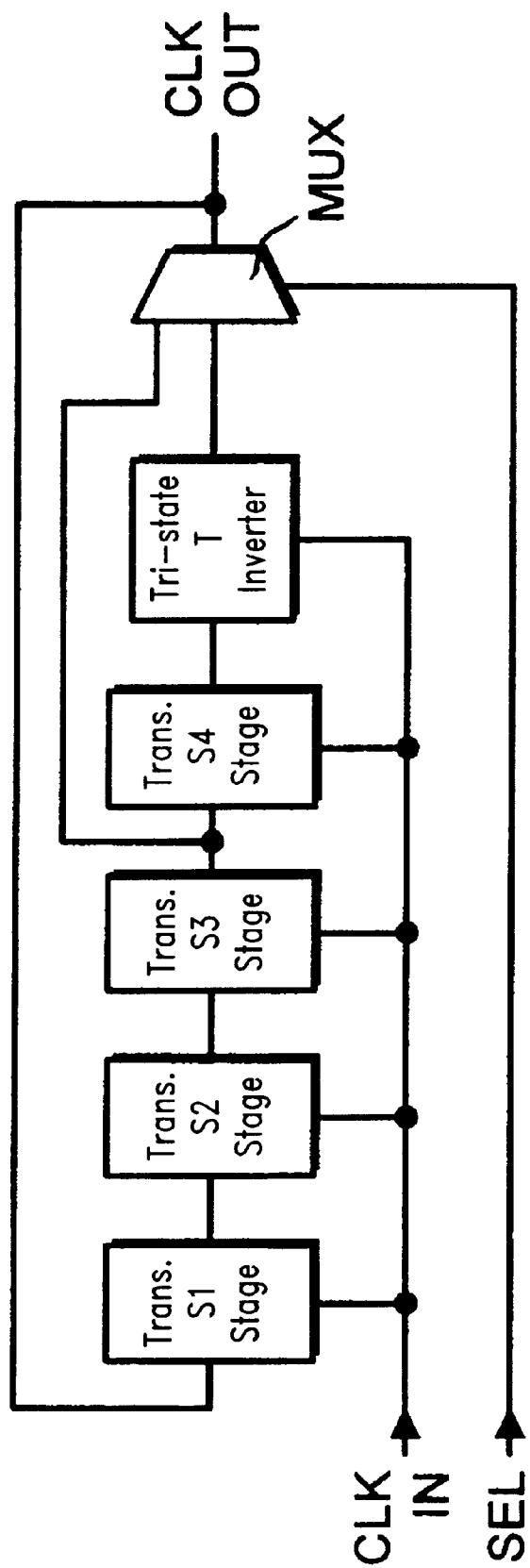
FIG. 15 shows a circuit diagram of a programmable circuit which can divide by three or four.

In the example of FIG. 13, the number of stages in the block B1 is not zero and thus the tri-state inverter stage T represents a branch which is selectively connectable in the divider ring. In an alternative construction, where no number of stages in the block B1 is zero, no branching is required as illustrated for example in the circuit of FIG. 15 which is a divide-by-three/divide-by-four programmable circuit. As can be seen, the circuit of FIG. 15 has the same configuration as the circuit of FIG. 7, apart from the fact that a multiplexer MUX is now included to selectively connect the output of the third stage S3 or the output of the tri-state inverter stage T to the first stage S1 of the ring. Thus, depending on the state of the select signal SEL supplied to the multiplexer MUX, the circuit either operates as a divide-by-three circuit or divide-by-four circuit.

FIG. 16 shows an example of a circuit which can selectively act as a divide-by-three, divide-by-four, or divide-by-five counter. The circuit of FIG. 16 has a structure very similar to that of FIG. 13. That is, there are five similar transistor stages S1 to S5 connected in sequence and a tri-state inverter stage T connected as a branch in parallel with the fifth transistor stage S5. However, in place of the two input multiplexer 20, a three input multiplexer 30 is provided controllable by two select signals SELa and SELb. The first input 32 of the multiplexer is connected to the output of the fifth transistor stage S5. The second input 34 of the multiplexer 30 is connected to the output of the third transistor stage S3. The third input 36 of the multiplexer 30 is connected to the output of the tri-state inverter stage T. A truth table for the circuit of FIG. 16 is shown in FIG. 16a. That is, when the select signals SELa and SELb cause the first input 32 of the multiplexer 30 to be supplied to its output, the circuit acts as a divide-by-five counter. When the state of the select signals SELa and SELb cause the second input 34 to be connected to the output of the multiplexer 30, the circuit acts as a divide-by-three counter. When the select signals SELa and SELb have states causing the third input 36 of the multiplexer 30 to be connected to its output, the circuit acts as a divide-by-four circuit.

Figure 17:
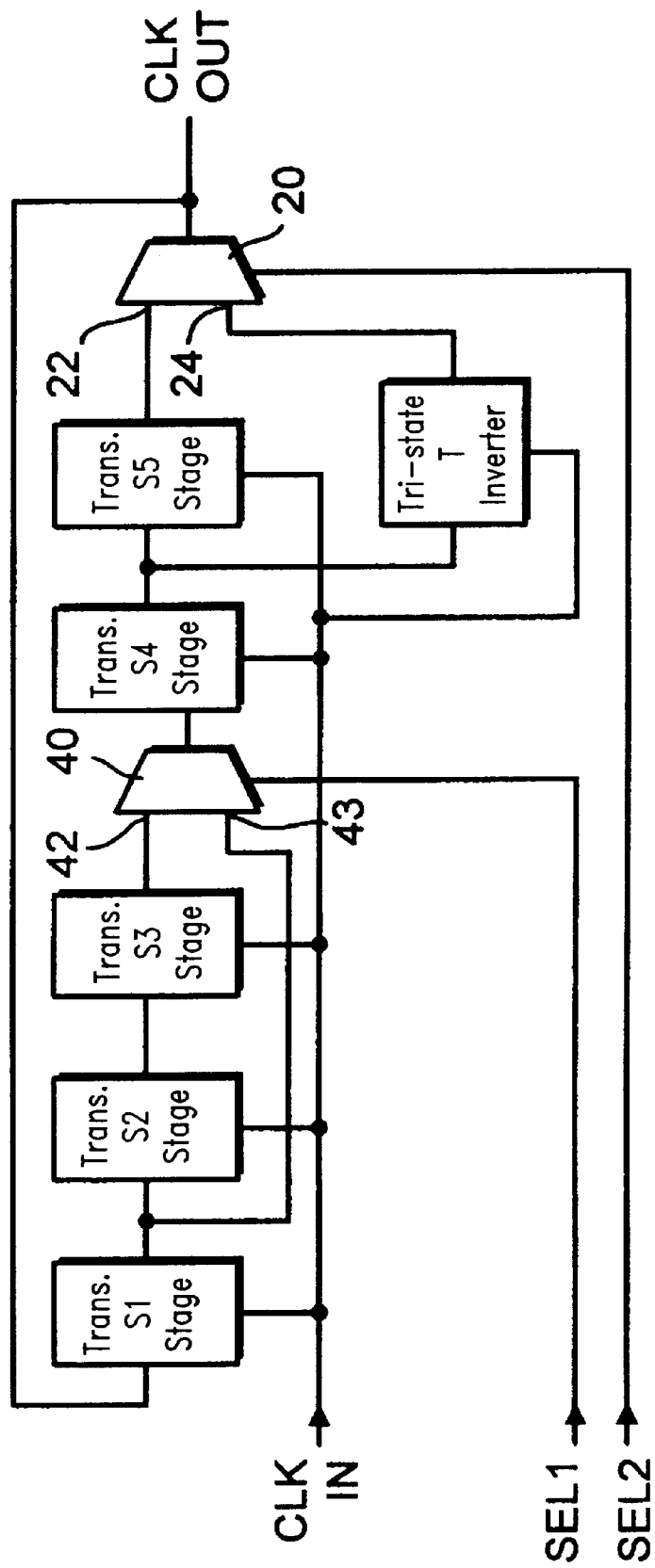
FIG. 17 shows a programmable circuit which can divide by two, three, four, or five.

A circuit of FIG. 17 can be programmable to divide by one of four integers 2, 3, 4 or 5. Like in FIG. 13, the circuit comprises five similar transistor stages S1 to S5 connected in sequence, and a tri-state inverter stage T connected as a branch in parallel with the fifth transistor stage S5. However, in addition to the multiplexer 20, another multiplexer 40 is connected in the circuit. The multiplexer 40 has a first input 42 connected to the output of the third transistor stage S3 and a second input 43 connected to the output of the first transistor stage S1. The output of the multiplexer 40 feeds the fourth transistor stage S4. The second multiplexer 20 has a first input 22 connected to the output of the fifth transistor stage S5 and a second input 24 connected to the output of the tri-state inverter T. The output of the second multiplexer 20 is supplied to the first transistor stage S1. The first multiplexer 40 is controlled by a select signal SEL1 and the second multiplexer 20 is controlled by a select signal SEL2. A truth table is shown in FIG. 17a. That is, when the second input 43 of the first multiplexer 40, and the second input 24 of the second multiplexer 20 are connected, then the circuit operates as a divide-by-two counter. When the first input 42 of the first multiplexer 40 and the second input 24 of the second multiplexer 20 are connected, the circuit operates as a divide-by-four counter. When the first input 42 of the first multiplexer 40 and the first input 22 of the second multiplexer 20 are connected, the counter operates as a divide-by-five counter. When the second input 43 of the first multiplexer 40 and the first input 22 of the second multiplexer 20 are connected, the counter operates as a divide-by-three counter. Thus, by the simple addition of two two-input multiplexers 40 and 20 to the basic circuit, a number of different options are easily provided.

Figure 18:
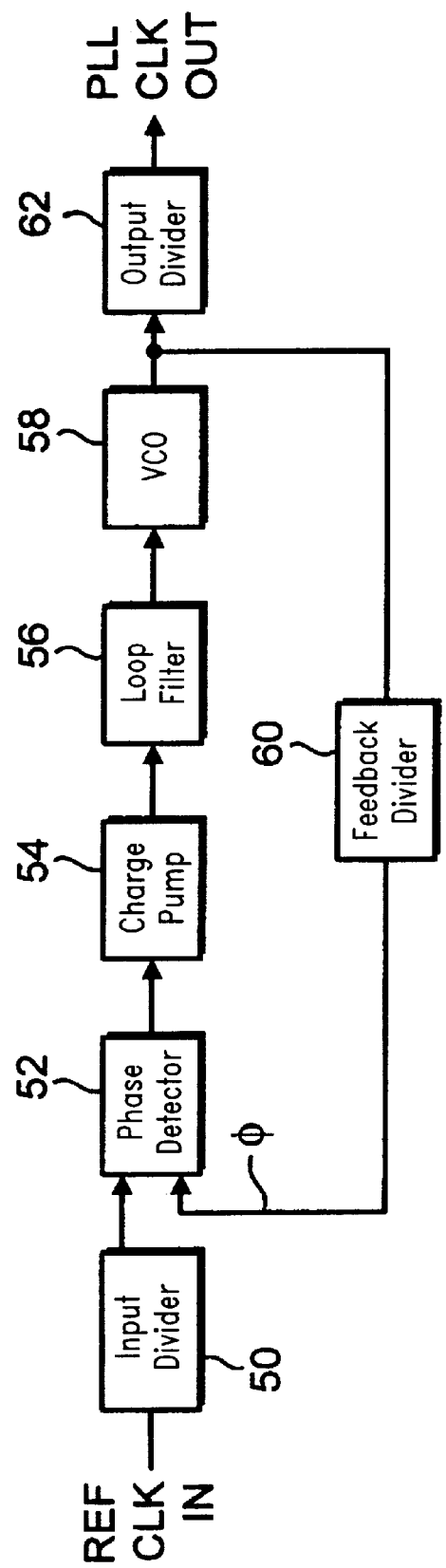
FIG. 18 shows a block diagram of a phase-locked-loop circuit.

FIG. 18 is a diagram of a basic phase-locked-loop circuit in which the dividing circuits described herein are particularly useful. The phase-locked-loop circuit receives a reference clock input REF CLK IN and generates a PLL clock output PLL CLK OUT. An input divider 50 creates from the reference clock input REF CLK IN a reference input frequency for a phase detector 52. The phase detector 52 also receives as an input a feedback signal φ generated in a manner described in the following. If the two inputs to the phase detector 52 differ in phase, an error output e is generated and is supplied to a charge pump 54. A loop filter 56 shapes the output of the charge pump 54 and generates a correction signal for a voltage controlled oscillator 58. The output of the voltage controlled oscillator 58 is passed through a feedback divider 60 to generate the second input (feedback signal φ) to the phase detector 52. The output of the voltage controlled oscillator 58 is also passed through an output divider 62 to generate the clock output PLL CLK OUT.

A dividing circuit in accordance with the present invention can usefully be used to implement any of the input divider 50, feedback divider 60, or output divider 62 to provide a phase-locked-loop circuit satisfying required technology, frequency and power constraints, in which the dividing factors are readily programmable.

From the foregoing, it will be appreciated that although specific embodiments of the invention have been described herein for purposes of illustration, various modifications may be made without deviating from the spirit and scope of the invention. Accordingly, the invention is not limited except by the appended claims, the scope of which are to be made in accordance with established doctrines of claim interpretation.

What is claimed is:

1. A programmable dividing circuit comprising:
 a first plurality N of similar transistor stages connected in a divide-by-N sequence, wherein N is an odd integer, the transistor stages configured so that when an output of a last stage is supplied to a first stage in the sequence, the dividing circuit operates as a divide-by-N circuit in which an output signal is generated having one cycle for every N cycles of a clock signal applied to the transistor stages;
 a tri-state inverter selectively connectable in a divide-by-M sequence with a second plurality M of transistor stages, wherein M is an even integer, and the second plurality includes at least one of said first plurality of transistor stages, including the first stage, whereby when an output of a last stage in the divide-by-M sequence is supplied to the first stage, the dividing circuit operates as a divide-by-M circuit in which an output signal is generated having one cycle for every M cycles of a clock signal applied to the transistor stages; and
 a switching circuit having at least two inputs and arranged to selectively connect to the first stage the output of the last stage in either the divide-by-N sequence or the divide-by-M sequence, whereby the dividing circuit can be programmed to operate as a divide-by-N or divide-by-M circuit.

2. The dividing circuit according to claim 1 wherein a total of M stages are connected in sequence with the tri-state inverter stage, the output of a last stage in the sequence of the total of M stages connected to one input of the switching circuit, the other input of the switching circuit connected to an output of an (M−p)th stage in the sequence of the total of M stages, where p is an odd integer and M−p=N.

3. The dividing circuit according to claim 2 wherein p=1.

4. The dividing circuit according to claim 2 wherein the tri-state inverter stage is a last stage in the divide-by-M sequence, the tri-state inverter stage generating an output signal having a duty cycle of 50%.

5. The dividing circuit according to claim 1 wherein a common sequence of an even number x of transistor stages has an output node connected to first and second circuit branches, the first branch comprising q transistor stages, wherein q is an odd integer greater than or equal to 1, and the second branch comprising r transistor stages and said tri-state inverter, wherein r is an even integer greater than or equal to zero, an output of the first and second branches connected to respective inputs of the switching circuit, wherein N=x+q and M=x+r.

6. The dividing circuit according to claim 5 wherein q=1 and r=0, whereby N=M+1.

7. The dividing circuit according to claim 1 wherein the switching circuit is a multiplexer.

8. The dividing circuit according to claim 1 wherein the switching circuit has a select input to receive a programming signal to effect the selective connection.

9. The dividing circuit according to claim 1 wherein the switching circuit has at least one further input to receive an output of one of the stages in the divide-by-N or divide-by-M sequence to allow selection of a further dividing factor.

10. The dividing circuit according to claim 1, further comprising another switching circuit having inputs connected to different stages in the divide-by-N or divide-by-M sequence and an output connected to a subsequent stage to allow selection of a further dividing factor.

11. A phase-locked-loop circuit, comprising:
 a phase detector having a first input to receive a reference signal and a second input to receive a feedback signal, the phase detector operable to generate an error signal according to a relative phase of the reference signal and the feedback signal;

a voltage controlled oscillator connected to receive a signal representative of the error signal generated by the phase detector; and a dividing circuit connected to receive an output from the voltage controlled oscillator and to divide the output by a predetermined integer to generate the feedback signal, the dividing circuit comprising:

a first plurality N of similar transistor stages connected in a divide-by-N sequence, wherein N is an odd integer, the transistor stages configured so that when an output of a last stage is supplied to a first stage in the sequence, the dividing circuit operates as a divide-by-N circuit in which an output signal is generated having one cycle for every N cycles of a clock signal applied to the transistor stages;

a tri-state inverter selectively connectable in a divide-by-M sequence with a second plurality M of transistor stages, wherein M is an even integer, and the second plurality includes at least one of said first plurality of transistor stages, including the first stage, whereby when an output of a last stage in the divide-by-M sequence is supplied to the first stage, the dividing circuit operates as a divide-by-M circuit in which an output signal is generated having one cycle for every M cycles of a clock signal applied to the transistor stages; and a switching circuit having at least two inputs and arranged to selectively connect to the first stage the output of the last stage in either the divide-by-N sequence or the divide-by-M sequence, whereby the dividing circuit can be programmed to operate as a divide-by-N or divide-by-M circuit.

12. A phase-locked-loop circuit, comprising:

a phase detector having a first input to receive a reference signal and a second input for receiving a feedback signal, the phase detector being operable to generate an error signal according to the relative phase of the reference signal and the feedback signal;

a voltage controlled oscillator connected to receive a signal representative of the error signal generated by the phase detector; and an input divider to divide the reference signal prior to the phase detector, the input divider comprising:

a first plurality N of similar transistor stages connected in a divide-by-N sequence, wherein N is an odd integer, the transistor stages configured so that when an output of a last stage is supplied to a first stage in the sequence, the dividing circuit operates as a divide-by-N circuit in which an output signal is generated having one cycle for every N cycles of a clock signal applied to the transistor stages;

a tri-state inverter selectively connectable in a divide-by-M sequence with a second plurality M of transistor stages, wherein M is an even integer, and the second plurality includes at least one of said first plurality of transistor stages, including the first stage, whereby when an output of a last stage in the divide-by-M sequence is supplied to the first stage, the dividing circuit operates as a divide-by-M circuit in which an output signal is generated having one cycle for every M cycles of a clock signal applied to the transistor stages; and a switching circuit having at least two inputs and arranged to selectively connect to the first stage the output of the last stage in either the divide-by-N sequence or the divide-by-M sequence, whereby the dividing circuit can be programmed to operate as a divide-by-N or divide-by-M circuit.

13. A phase-locked-loop circuit, comprising:

a phase detector having a first input to receive a reference signal and a second input to receive a feedback signal, the phase detector operable to generate an error signal according to the relative phase of the reference signal and the feedback signal;

a voltage controlled oscillator connected to receive a signal representative of the error signal generated by the phase detector; and an output divider connected to receive the output from the voltage controlled oscillator to generate a divided output signal, the output divider comprising:

a first plurality N of similar transistor stages connected in a divide-by-N sequence, wherein N is an odd integer, the transistor stages configured so that when an output of a last stage is supplied to a first stage in the sequence, the dividing circuit operates as a divide-by-N circuit in which an output signal is generated having one cycle for every N cycles of a clock signal applied to the transistor stages;

a tri-state inverter selectively connectable in a divide-by-M sequence with a second plurality M of transistor stages, wherein M is an even integer, and the second plurality includes at least one of said first plurality of transistor stages, including the first stage, whereby when an output of a last stage in the divide-by-M sequence is supplied to the first stage, the dividing circuit operates as a divide-by-M circuit in which an output signal is generated having one cycle for every M cycles of a clock signal applied to the transistor stages; and a switching circuit having at least two inputs and arranged to selectively connect to the first stage the output of the last stage in either the divide-by-N sequence or the divide-by-M sequence whereby the dividing circuit can be programmed to operate as a divide-by-N or divide-by-M circuit.

14. A dividing circuit programmable to divide by an N odd integer or an M even integer, comprising:

a first plurality of N transistor stages connectable in a divide-by-N sequence, the first plurality of N transistor stages configurable to supply an output of a last transistor stage in the divide-by-N sequence to a first transistor stage in the divide-by-N sequence, a transistor stage in the first plurality of N transistor stages generating a first output signal having one cycle for every N cycles of a clock signal applied to the transistor stages;

a tri-state inverter stage;

a second plurality of M transistor stages connectable to the tri-state inverter stage in a divide-by-M sequence, the divide-by-M sequence including at least the first transistor stage in the divide-by-N sequence, the divide-by-M sequence configurable to supply an output of a last stage in the divide-by-M sequence to the first transistor stage in the divide-by-N sequence to generate a second output signal having one cycle for every M cycles of the clock signal; and a switching circuit having a first input connected to the last transistor stage in the divide-by-N sequence and a second input connected to the last stage in the divide-by-M sequence, the switching circuit selectable to connect either the first or second inputs to the first transistor stage in the divide-by-N circuit to respectively program the dividing circuit produce the first or second output signals.

15. The dividing circuit of claim 14 wherein the first input of the switching circuit is connected to an output of the (M−p)th stage in the sequence, where p is an odd integer and M−p=N.

16. The dividing circuit of claim 14 wherein a common sequence of an even number x of transistor stages has an output node connected to first and second circuit branches, the first branch comprising q transistor stages and the second branch comprising r transistor stages and the tri-state inverter stage, with outputs of the first and second branches respectively connected to the first and second inputs of the switching circuit, wherein N=x+q, M=x+r, q is an odd integer greater than or equal to 1, and r is an even integer greater than or equal to zero.

17. The dividing circuit of claim 16 wherein q=1 and r=0.

18. The dividing circuit of claim 14 wherein the switching circuit is a multiplexer, the multiplexer having a select input to receive a programming signal to effect the selective connection.

19. A phase-locked-loop circuit, comprising:
  a phase detector having a first input for receiving a reference signal and a second input for receiving a feedback signal, the phase detector operable to generate an error signal according to a relative phase of the reference signal and the feedback signal;
  a voltage controlled oscillator connected to receive a signal representative of the error signal generated by the phase detector;
  a feedback divider circuit connected to receive an output from the voltage controlled oscillator and to divide the output by a predetermined integer to generate the feedback signal; and
  an input divider to divide the reference signal prior to the phase detector, the input divider comprising a dividing circuit programmable to divide by an N odd integer or an M even integer, comprising:
    a first plurality of N transistor stages connectable in a divide-by-N sequence, the first plurality of N transistor stages configurable to supply an output of a last transistor stage in the divide-by-N sequence to a first transistor stage in the divide-by-N sequence, a transistor stage in the first plurality of N transistor stages generating a first output signal having one cycle for every N cycles of a clock signal applied to the transistor stages;
    a tri-state inverter stage;
    a second plurality of M transistor stages connectable to the tri-state inverter stage in a divide-by-M sequence, the divide-by-M sequence including at least the first transistor stage in the divide-by-N sequence, the divide-by-M sequence configurable to supply an output of a last stage in the divide-by-M sequence to the first transistor stage in the divide-by-N sequence to generate a second output signal having one cycle for every M cycles of the clock signal;
  a switching circuit having a first input connected to the last transistor stage in the divide-by-N sequence and a second input connected to the last stage in the divide-by-M sequence, the switching circuit selectable to connect either the first or second inputs to the first transistor stage in the divide-by-N circuit to respectively program the dividing circuit produce the first or second output signals.

20. The phase-locked-loop circuit of claim 19, further comprising an output divider connected to receive the output from the voltage controlled oscillator to generate a divided output signal.

* * * * *